(12) United States Patent
Cheng et al.

(10) Patent No.: US 10,431,639 B2
(45) Date of Patent: Oct. 1, 2019

(54) DISPLAY SUBSTRATE, MANUFACTURING METHOD THEREOF AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Leilei Cheng, Beijing (CN); Bin Zhou, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/743,082

(22) PCT Filed: Jun. 29, 2017

(86) PCT No.: PCT/CN2017/090895
§ 371 (c)(1),
(2) Date: Jan. 9, 2018

(87) PCT Pub. No.: WO2018/099062
PCT Pub. Date: Jun. 7, 2018

(65) Prior Publication Data
US 2019/0081115 A1    Mar. 14, 2019

(30) Foreign Application Priority Data

Nov. 30, 2016   (CN) .......................... 2016 1 1082981

(51) Int. Cl.
*H01L 27/32* (2006.01)
*H01L 51/52* (2006.01)
(Continued)

(52) U.S. Cl.
CPC ...... *H01L 27/3246* (2013.01); *H01L 51/5203* (2013.01); *H01L 51/56* (2013.01); *H01L 51/0005* (2013.01); *H01L 2227/323* (2013.01)

(58) Field of Classification Search
None
See application file for complete search history.

(56) References Cited

U.S. PATENT DOCUMENTS

2003/0222267 A1* 12/2003 Kim .................... H01L 27/3246
257/98
2005/0142974 A1* 6/2005 Lee .................... H01L 27/3246
445/24
(Continued)

FOREIGN PATENT DOCUMENTS

CN     101477304 A    2/2009
CN     102705790 A    10/2012
(Continued)

OTHER PUBLICATIONS

The First Chinese Office Action dated Dec. 18, 2017; Appln. No. 201611082981.4.
(Continued)

*Primary Examiner* — Shaun M Campbell
(74) *Attorney, Agent, or Firm* — Ladas & Parry LLP

(57) ABSTRACT

A display substrate, a manufacturing method thereof, and a display device are provided, and the manufacturing method includes: providing a base substrate; forming a pixel definition layer on the base substrate; oxidizing the pixel definition layer, in which a surface of the pixel definition layer distal to the base substrate is partially oxidized, such that the pixel definition layer includes a main layer proximal to the base substrate and an oxide layer distal to the base substrate;

(Continued)

curing and molding the pixel definition layer, and patterning the pixel definition layer to form a pixel definition layer pattern.

18 Claims, 3 Drawing Sheets

(51) Int. Cl.
*H01L 51/56* (2006.01)
*H01L 51/00* (2006.01)

(56) References Cited

U.S. PATENT DOCUMENTS

| | | | |
|---|---|---|---|
| 2010/0258833 A1* | 10/2010 | Okumoto | H01L 51/5209 257/98 |
| 2014/0131743 A1* | 5/2014 | Jiang | H01L 27/3246 257/88 |
| 2014/0139102 A1* | 5/2014 | Jeon | H01L 27/3246 313/504 |
| 2014/0203303 A1* | 7/2014 | Jiang | H01L 51/56 257/88 |
| 2015/0243705 A1 | 8/2015 | Kim | |
| 2016/0214281 A1 | 7/2016 | Chen et al. | |
| 2017/0330921 A1 | 11/2017 | Lee et al. | |
| 2018/0090682 A1* | 3/2018 | Shi | H01L 27/3283 |

FOREIGN PATENT DOCUMENTS

| | | |
|---|---|---|
| CN | 102945855 A | 2/2013 |
| CN | 104409653 A | 3/2015 |
| CN | 104517999 A | 4/2015 |
| CN | 103227190 B | 6/2015 |
| CN | 104867405 A | 8/2015 |
| CN | 105774279 A | 7/2016 |
| CN | 106067478 A | 11/2016 |
| CN | 106784366 A | 5/2017 |
| EP | 0989778 A1 | 3/2000 |
| JP | 2008-243406 A | 10/2008 |

OTHER PUBLICATIONS

International Search Report and Written Opinion dated Oct. 12, 2017; PCT/CN2017/090895.

* cited by examiner oxidation treatment

DISPLAY SUBSTRATE, MANUFACTURING METHOD THEREOF AND DISPLAY DEVICE

TECHNICAL FIELD

At least one embodiment of the present disclosure relates to a display substrate and a manufacturing method thereof, and a display device.

BACKGROUND

In a process of manufacturing a display substrate (for example, an active-matrix organic light emitting device (AMOLED) display substrate) by an ink-jet printing method, the pixel definition layer is used for defining a shape of the pixel and storing the ink. In order to prevent the ink from being mixed between adjacent pixels, the surface of the pixel definition layer should have a strong hydrophobic property. At the same time, in order to make the ink in a minor shift (for example, the ink drops on the inner edge of the pixel) roll into the pixel groove, the pixel definition layer includes a lower layer with hydrophilic property, and an upper layer with hydrophobic property. However, during above process, there are interface problems in the two-layer structure (the hydrophilic portion and the hydrophobic portion) of the pixel definition layer due to that the pixel definition layer are prone to stratification, which cannot satisfy the requirements of the actual process.

SUMMARY

At least one embodiment of the present disclosure provides a display substrate, and the display substrate comprises a base substrate and a pixel definition layer pattern disposed on the base substrate, the pixel definition layer pattern comprises a main layer proximal to the base substrate and an oxide layer distal to the base substrate, and the main layer and the oxide layer are obtained by partially oxidizing a material layer for forming the pixel definition layer pattern.

For example, in the display substrate provided by at least one embodiment of the present disclosure, the main layer is configured to be a hydrophilic layer, and the oxide layer is configured to be a hydrophobic layer.

For example, in the display substrate provided by at least one embodiment of the present disclosure, the pixel definition layer pattern is made of siloxane based organic material, and the siloxane based organic material comprises at least one of hydroxylated polydimethylsiloxane or polystyrene block polydimethylsiloxane.

For example, in the display substrate provided by at least one embodiment of the present disclosure, a thickness of an oxidized portion of the pixel definition layer pattern is 30% to 80% of a total thickness of the pixel definition layer pattern.

For example, in the display substrate provided by at least one embodiment of the present disclosure, in a direction perpendicular to a plane of the base substrate, the pixel definition layer has a thickness ranged from 1 μm to 2 μm.

For example, the display substrate provided by at least one embodiment of the present disclosure further comprises an organic light emitting device arranged in a pixel region defined by the pixel definition layer pattern.

For example, in the display substrate provided by at least one embodiment of the present disclosure, the organic light emitting device comprises a first electrode arranged on the base substrate, an organic light emitting layer arranged on the first electrode and a second electrode arranged on the organic light emitting layer.

At least one embodiment of the present disclosure further provides a display device, and the display device comprises any one of the display substrate described above.

At least one embodiment of the present disclosure further provides a method for manufacturing a display substrate, and the manufacturing method comprises: providing a base substrate; forming a pixel definition layer on the base substrate; oxidizing the pixel definition layer, wherein a surface of the pixel definition layer distal to the base substrate is partially oxidized, such that the pixel definition layer comprises a main layer proximal to the base substrate and an oxide layer distal to the base substrate; curing and molding the pixel definition layer, and patterning the pixel definition layer to form a pixel definition layer pattern.

For example, in the manufacturing method provided by at least one embodiment of the present disclosure, the main layer is a hydrophilic layer, and the oxide layer is a hydrophobic layer.

For example, in the manufacturing method provided by at least one embodiment of the present disclosure, the pixel definition layer pattern is made of siloxane based organic material, and the siloxane based organic material comprises at least one of hydroxylated polydimethylsiloxane or polystyrene block polydimethylsiloxane.

For example, in the manufacturing method provided by at least one embodiment of the present disclosure, the pixel definition layer is partially oxidized by ultraviolet or ozone.

For example, in the manufacturing method provided by at least one embodiment of the present disclosure, a thickness of the oxidized portion of the pixel definition layer pattern is 30% to 80% of a total thickness of the pixel definition layer.

For example, in the manufacturing method provided by at least one embodiment of the present disclosure, in a direction perpendicular to a plane of the base substrate, the pixel definition layer has a thickness ranged from 1 μm to 2 μm.

For example, in the manufacturing method provided by at least one embodiment of the present disclosure, a temperature for curing and molding the pixel definition layer is in a range from 25° C. to 100° C.

For example, in the manufacturing method provided by at least one embodiment of the present disclosure, a time for curing and molding the pixel definition layer is in a range from 0.5 hour to 6 hour.

For example, the manufacturing method provided by at least one embodiment of the present disclosure further comprises: forming an organic light emitting device in a pixel region defined by the pixel definition layer pattern.

For example, in the manufacturing method provided by at least one embodiment of the present disclosure, forming the organic light emitting device comprises: forming a first electrode on the base substrate; forming an organic light emitting layer on the first electrode; and forming a second electrode on the organic light emitting layer.

For example, in the manufacturing method provided by at least one embodiment of the present disclosure, the organic light emitting layer is formed by an ink-jet printing method.

BRIEF DESCRIPTION OF THE DRAWINGS

In order to clearly illustrate the technical solution of the embodiments of the disclosure, the drawings of the embodiments will be briefly described in the following, it is obvious

DETAILED DESCRIPTION

Figure 1:
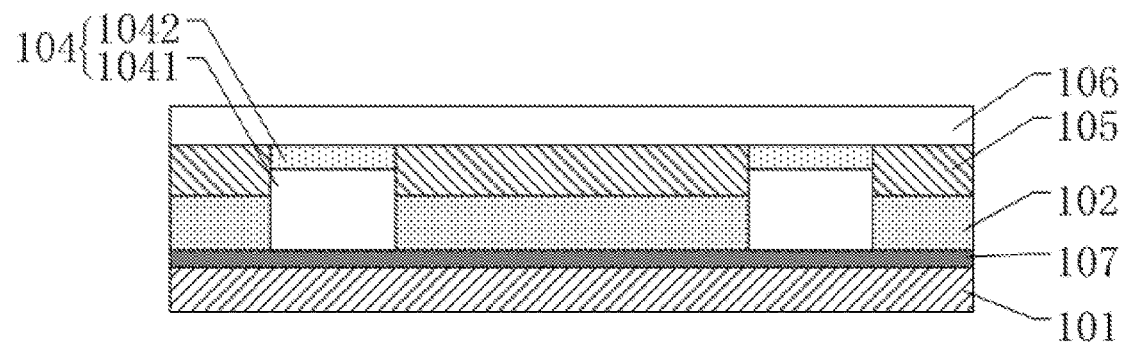
FIG. 1 is a structure schematic view of a display substrate provided by an embodiment of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the current manufacturing process of the display substrate, a two-layer structure of a pixel definition layer is manufactured by two steps, the two steps are complicated and use different equipments. Especially, a plasma enhanced chemical vapor deposition (PECVD) process needs to be performed in the step of manufacturing inorganic materials having hydrophilic property, the equipment is expensive and the cost is high. For example, in the preparation method of an organic thin film electroluminescent device, the pixel definition layer (PDL) is formed of two layers with materials having different wettabilities, in order to make the solution of the organic electroluminescent material ink-jet printed accurately and to form the organic electroluminescent material film with a uniform thickness. During the process of manufacturing the pixel definition layer, an inorganic hydrophilic material layer first needs to be made, and an organic hydrophobic material layer is formed on the inorganic hydrophilic property material layer, and then the inorganic hydrophilic material layer and the organic hydrophobic material layer are patterned to manufacture the pixel definition layer. In another example, the two-layer structure of the pixel definition layer is formed on the substrate by plasma treatment, in this way, the first layer (the lower layer) has a high surface energy (hydrophilic property material) and the second layer (the upper layer) has a low surface energy (hydrophobic property material). Although the plasma treatment method appears to satisfy the requirements of accurate ink-jet printing and homogeneity of thin films, similar to the above-mentioned method, there are interface problems in the two-layer structure (the hydrophilic portion and the hydrophobic portion) of the pixel definition layer due to that the pixel definition layer are prone to stratification.

At least one embodiment of the present disclosure provides a display substrate and a manufacturing method thereof, and a display device. The display substrate comprises a base substrate and a pixel definition layer pattern, the pixel definition layer is made of modified siloxane based organic material, such as hydroxylated PDMS (or polystyrene block polydimethylsiloxane and its derivatives), then the surface of the pixel definition layer is oxidized, as a result, a thin film with hydrophobic property is formed on one side of the pixel definition layer under oxidation treatment, for example, a silicon dioxide thin film. The oxidized portion of the pixel definition layer is transformed into an oxide layer having hydrophobic property, while the non-oxidized portion proximal to the base substrate is still a main layer having hydrophilic property. Then, the resulting layer is patterned to form the pixel definition layer pattern. The subsequent preparation process of the display substrate is based on the pixel definition layer pattern. Therefore, the pixel definition layer pattern, the display substrate and the display device of the present disclosure are manufactured in a simple way.

It should be noted that, the hydrophilic property and the hydrophobic property depend on the nature of the object itself, for example, it depends on the contact state of the two objects. If the surface of the object is easily wetted by a liquid medium, the object has hydrophilic property; to the contrary, if the surface of the object is difficultly wetted by a liquid medium, it has hydrophobic property. For example, in the following embodiments of the present disclosure, taking ink-jet printing as an example, the main layer of the pixel definition layer pattern adsorbs the ink, so that the ink is not easily separated from the main layer, and the main layer is a hydrophilic layer. In a case that the ink falls on the oxide layer of the pixel definition layer pattern, it will roll to other positions (such as fall on the position of the main layer), so the ink will naturally separated from the oxide layer, that is, the oxide layer is a hydrophobic layer.

At least one embodiment of the present disclosure provides a display substrate, and FIG. 1 is a structure schematic view of a display substrate provided by an embodiment of the present disclosure. For example, as illustrated in FIG. 1, the display substrate comprises a base substrate 101 and a pixel definition layer pattern 104 disposed on the base substrate 101.

The pixel definition layer pattern 104 is made of hydrophilic property material, and formed by a single film forming process and a single patterning process, so the preparation process is simple. After the pixel definition layer is prepared by the hydrophilic material, the pixel definition layer is oxidized, and the oxidized portion is transformed into an oxide layer having a hydrophobic property, the non-oxidized portion is still the main layer with a hydrophilic property, then a patterning process is performed to form the pixel definition layer pattern. Therefore, there is no interface problem between the main layer 1041 and the oxide layer 1042 of the obtained pixel definition layer pattern 104, and the pixel definition layer patter is not prone to stratification, as a result, the stability of the pixel definition layer pattern 104 is increased.

The main layer 1041 having a hydrophilic property and the oxide layer 1042 having a hydrophobic property constitute a two-layer structure of a hydrophilic-hydrophobic property of the pixel definition layer pattern 104. In the subsequent preparation process of the display substrate, for example, in the ink-jet printing process of organic functional materials (including organic light-emitting materials), the droplet, for example the ink, falling on the pixel definition layer pattern 104 (or falling on the edge of the pixel definition layer pattern 104) will roll to the pixel region defined by the pixel definition layer pattern 104 due to the hydrophobic property of the oxide layer 1042; the droplet, for example the ink, falling on the pixel region (or falling on the edge of the pixel definition layer pattern 104) will be adsorbed in the pixel region defined by the pixel definition layer pattern 104 due to the hydrophilic property of the main layer 1041.

For example, the pixel definition layer pattern 104 is made of siloxane based organic material, and the pixel definition layer pattern 104 is modified by, for example, hydrophilic functional groups (for example, from hydrophobic to hydrophilic). For example, polydimethylsiloxane (PDMS) has an electrical insulation property and a high-low temperature resistance property, and polydimethylsiloxane may be used for a long time at the temperature range from −50° C. to +250° C, it has high compression rate and low surface tension. Polydimethylsiloxane has good hydrophobic property and low surface energy, it is easy to achieve a smooth and uniform coating when it is in a fluid state. PDMS polymers is capable of being modified, such as hydroxylation modification, so it may be transformed into a hydroxylated PDMS having hydrophilic property. The hydroxylated PDMS, which has a hydrophilic property, is converted to an inorganic silica layer with a hydrophobic property after oxidation treatment, such that it satisfies the requirements for forming the two-layer structure of a hydrophilic-hydrophobic property of the pixel definition layer pattern 104.

The siloxane based organic material used in at least one embodiment of the present disclosure is not limited to the hydroxylated polydimethylsiloxane, polystyrene block polydimethylsiloxane and its derivatives also have hydrophilic property. After being oxidized, it may also be transformed into an inorganic silica layer having hydrophobic property, and the same technical effect may also be obtained.

For example, in the display substrate provided by at least one embodiment of the present disclosure as illustrated in FIG. 1, a thickness of the oxide layer 1042 is from 30% to 80% of a total thickness of the pixel definition layer pattern 104. The proportion of the oxide layer 1042 in the pixel definition layer pattern 104 is determined by the process conditions and structural requirements for the preparation of the display substrate.

The pixel region defined by the pixel definition layer pattern is used to store "ink" for printing, that is a liquid material used for forming an organic functional layer, for example, in the preparation process of the display substrate, such as ink-jet printing, so the pixel definition layer pattern needs a certain thickness. For example, in the display substrate provided by at least one embodiment of the present disclosure, in a direction perpendicular to a plane of the base substrate, the pixel definition layer has a thickness ranged from 1 μm to 2 μm.

For example, in the display substrate provided by at least one embodiment of the present disclosure, as illustrated in FIG. 1, the display substrate further comprises an organic light emitting device (not illustrated in FIG. 1) arranged in a pixel region defined by the pixel definition layer pattern 104. The organic light emitting device comprises a first electrode 102, an organic light emitting layer 105 and a second electrode 106 arranged on the base substrate 101 subsequently. The electroluminescent performance of the organic light emitting layer 105 in the corresponding pixel region is controlled by voltages applied on the first electrode 102 and the second electrode 106. For example, the first electrode 102 is formed between the base substrate 101 and the pixel definition layer pattern 104, or the first electrode 102 is not formed on the base substrate 101 at a position that the pixel definition layer pattern 104 is located (for example, the first electrode 102 is formed in a region defined by the pixel definition layer pattern 104).

One of the first electrode and the second electrode is an anode, and the other one is a cathode. Besides the organic light emitting layer, the organic light emitting device may further comprise, for example, a hole injection layer, a hole transport layer, an electronic injection layer, an electron transport layer, a hole blocking layer, an electronic blocking layer or any combination thereof as needed.

For example, the second electrode 106 is not limited to be arranged in the pixel region. As illustrated in FIG. 1, the second electrode 106 is arranged at a side of the pixel definition layer pattern 104 distal to the base substrate 101 and serves a common electrode.

For example, in the display substrate provided by at least one embodiment of the present disclosure, as illustrated in FIG. 1, the display substrate further comprises a pixel circuit layer 107, which is arranged between the base substrate 101 and the pixel definition layer pattern 104, and the pixel circuit layer 107 comprises a driving thin film transistor. A source electrode or a drain electrode (not illustrated in FIG. 1) of the driving thin film transistor is connected with the first electrode, and is supplied with a driving voltage to control the luminous state of the organic light-emitting layer 105 between the first electrode 102 and the second electrode 106. Moreover, the pixel circuit layer 107 may further comprise circuits such as a switch transistor, a storage capacitor, and the like.

At least one embodiment of the present disclosure further provides a display device, and the display device comprises the display substrate provided by the above embodiments of the present disclosure.

For example, the display device may further comprise a display driving circuit, a power supplying circuit, or a touching circuit, and so on.

For example, the display device is a display, a tablet computer, a mobile phone, a television, a camera, a navigation system and any other product or component having a display function.

At least one embodiment of the present disclosure further provides a method for manufacturing a display substrate. For example, the method comprises: providing a base substrate; forming a pixel definition layer on the base substrate; oxidizing the pixel definition layer, a surface of the pixel definition layer distal to the base substrate is partially oxidized, such that the pixel definition layer comprises a main layer proximal to the base substrate and an oxide layer distal to the base substrate; curing and molding the pixel definition layer, and patterning the pixel definition layer to form a pixel definition layer pattern. In the preparation of the display substrate, the pixel definition layer included in the display substrate is formed through a single film forming process by using hydrophilic material, and then the surface of the pixel definition layer is oxidized, such that the oxidized portion is transformed into a hydrophobic material. As a result, the processes of preparing the pixel definition layer, the corresponding display substrate and the display device are simplified, and the cost is reduced. Furthermore, there is no interface problem in the pixel definition layer formed by this method because the pixel definition layer is difficult to stratification, and the stability of the pixel definition layer is increased.

For example, the method for manufacturing the display substrate further comprises: forming an organic light emitting device in a pixel region defined by the pixel definition layer pattern.

For example, in the preparation of the display substrate, forming the organic light emitting device comprises: forming a first electrode on the base substrate; forming an organic light emitting layer on the first electrode; and forming a second electrode on the organic light emitting layer. For example, the first electrode is formed between the base substrate and the pixel definition pattern firstly, and then the pixel definition layer pattern is formed, after that the organic light layer and the second electrode are formed. Alternatively, the pixel definition layer is formed on the base substrate firstly, then the first electrode, the organic light emitting layer and the second electrode are formed in sequence.

For example, the method for manufacturing the display substrate further comprises: forming a thin film transistor on the base substrate, in which the thin film transistor is between the base substrate and the first electrode, and the first electrode is electrically connected to a source electrode or a drain electrode of the thin film transistor.

For example, in the method for manufacturing the display substrate provided by at least one embodiment of the present disclosure, the specific structure of the display substrate refers to the related contents in the previous embodiments (the embodiments of the display substrate), which are not elaborated herein.

Figure 2A:
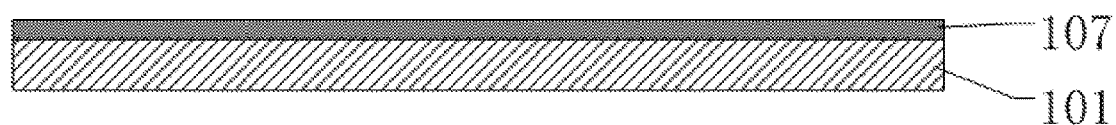
FIG. 2a to FIG. 2g are step diagrams during the manufacturing method of a display substrate provided by an embodiment of the present disclosure.

FIG. 2a to FIG. 2g are step diagrams during the manufacturing method of a display substrate provided by an embodiment of the present disclosure. With reference to FIG. 2a to FIG. 2g, the manufacturing method of a display substrate provided by an embodiment of the present disclosure comprises the following steps:

As illustrated in FIG. 2a, providing a base substrate 101, and forming a pixel circuit layer 107 which comprises a driving thin film transistor on the base substrate 101.

Figure 2B:
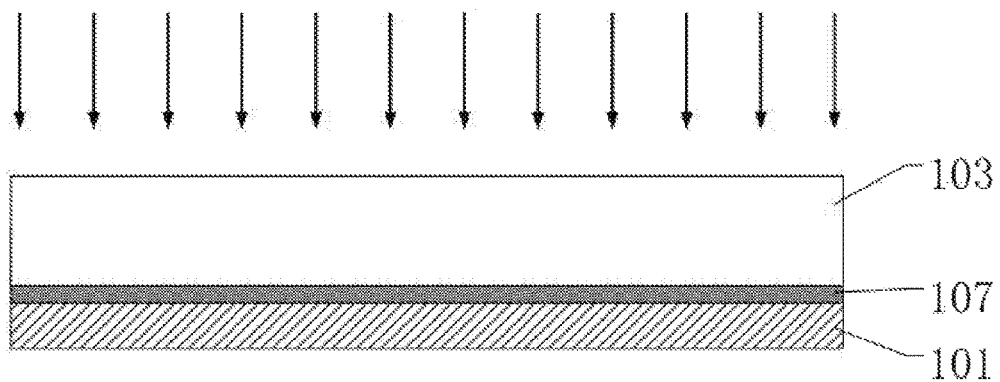

As illustrated in FIG. 2b, forming a pixel definition layer 103 on the base substrate 101 with the pixel circuit layer 107 formed thereon, and oxidizing a surface of the pixel definition layer.

For example, the pixel definition layer 103 is made of siloxane based organic material, and the siloxane based organic material comprises hydroxylated polydimethylsiloxane or polystyrene block polydimethylsiloxane. The siloxane based organic material is transformed into a hydrophobic material after oxidation treatment, for example, silicon dioxide with hydrophobic property.

For example, in the present embodiment, the surface of the pixel definition layer 103 is oxidized by ultraviolet light or ozone. For example, the pixel definition layer 103 made of hydroxylated PDMS material is oxidized by ultraviolet (UV) light. A layer of silicon dioxide film that is slightly harder than the PDMS film layer is formed on the oxidized portion of the pixel definition layer 103, the silicon dioxide film is a hydrophobic film.

The proportion of a thickness of the oxidized portion in a total thickness of the pixel definition layer 103 is determined by the actual requirements. For example, the proportion of the thickness of the oxidized portion in the total thickness of the pixel definition layer 103 is controlled by the period of oxidizing. For example, the pixel definition layer 103 made of hydroxylated PDMS material is oxidized by ultraviolet (UV) light with a wavelength from 185 nm to 253 nm for 15 seconds (s) to 20 minutes (min), and a thickness of an oxidized portion of the pixel definition layer pattern is 30% to 80% of a total thickness of the pixel definition layer pattern.

Figure 2C:
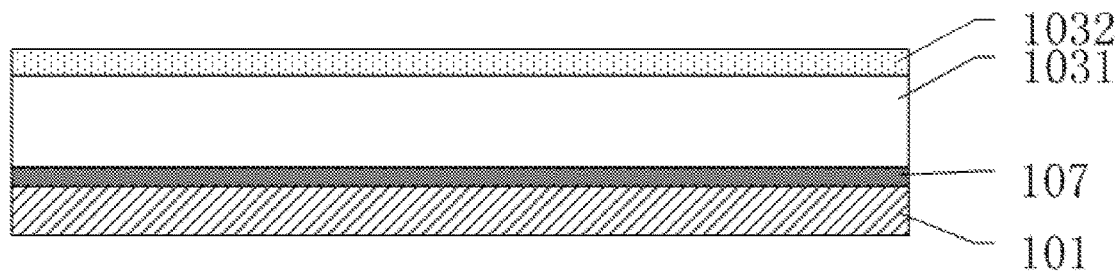

As illustrated in FIG. 2c, after oxidation treatment, the oxidized portion of the pixel definition layer 103 is a hydrophobic layer 1032 having hydrophobic property, the non-oxidized portion of the pixel definition layer 103 still has hydrophilic property, i.e., it is a hydrophilic layer 1031, then the pixel definition layer 103 is cured and molded to a solid state.

For example, in the present embodiment, a temperature for curing and molding the pixel definition layer is in a range from 25° C. to 100° C., a time for curing and molding the pixel definition layer is in a range from 0.5 hour to 6 hours, the time and temperature of curing process vary with the material. For example, the pixel definition layer 103 made of hydroxylated PDMS material is cured and molded at the temperature of 60° C., and the processing time is 4 hours.

Figure 2D:
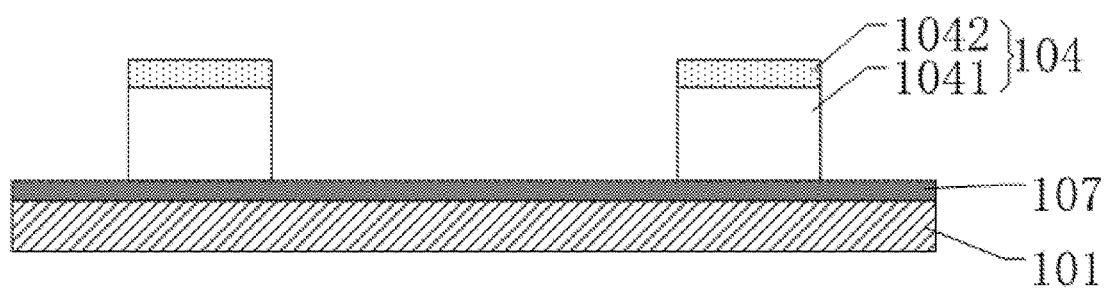

As illustrated in FIG. 2d, patterning the pixel definition layer 103 (comprising the hydrophilic layer 1031 and the hydrophobic layer 1032) to form a pixel definition layer pattern 104, the hydrophilic layer 1031 forms a main layer 1041, and the hydrophobic layer 1032 forms an oxide layer 1042, the main layer 1041 and the oxide layer 1042 constitute a hydrophilic-hydrophobic two-layer structure of the pixel definition layer 104.

For example, the patterning process is a photolithography process, and the photolithography process comprises: coating a photoresist layer on the structure required to be patterned, exposing the photoresist layer by using a mask, developing the photoresist layer which has been exposed to obtain a photoresist pattern, etching the layer structure required to be patterned by using the photoresist pattern, and then optionally removing the photoresist pattern.

After the pixel definition layer pattern 104 is formed, an organic light emitting device (which is not illustrated in FIG. 2d) is formed in a region defined by the pixel definition layer pattern, and the organic light emitting device comprises a first electrode, an organic light emitting layer and a second electrode. The preparation process of the organic light emitting device is illustrated in FIG. 2e to FIG. 2g.

Figure 2E:
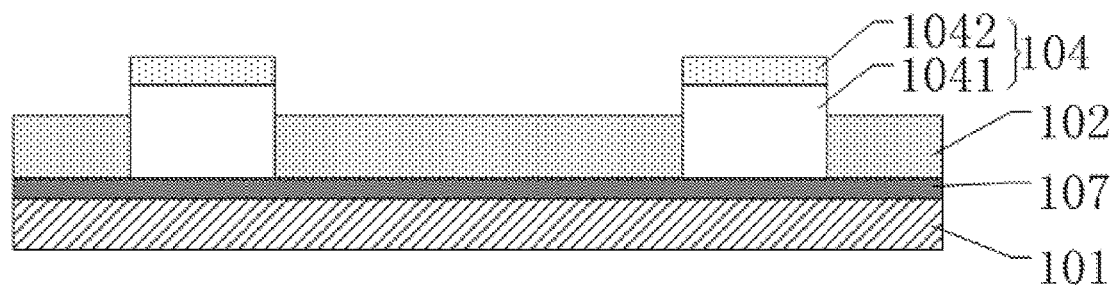

As illustrated in FIG. 2e, depositing a first electrode film in the region defined by the pixel definition layer pattern 104, and forming a first electrode 102 in the display region defined by the pixel definition layer pattern by the patterning process, and the first electrode is electrically connected to a source electrode or a drain electrode of the thin film transistor 107.

For example, the first electrode 102 is made of a transparent conductive material or a metal material, for example, the first electrode is made of indium tin oxide (ITO), indium zinc oxide (170), indium gallium oxide (100), gallium doped zinc oxide (GZO), zinc oxide (ZnO), indium oxide ($In_2O_3$), aluminum zinc oxide (AZO), carbon nanotubes, and the like.

Figure 2F:
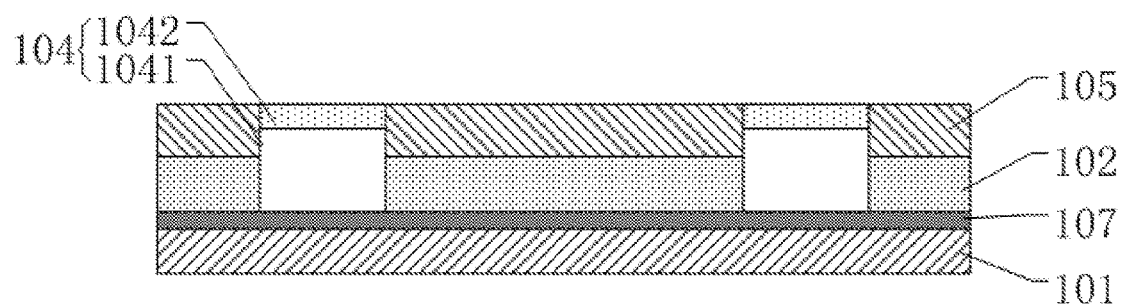
Figure 2G:
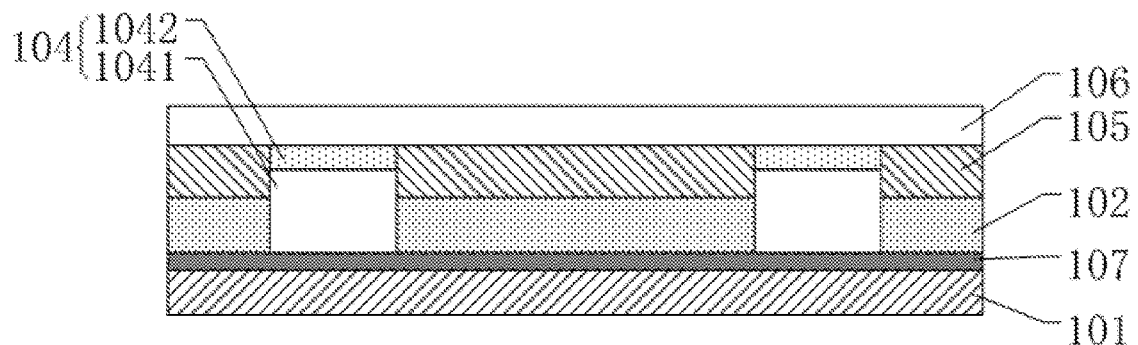

As illustrated in FIG. 2f, an organic light emitting layer 105 is formed on the first electrode 102.

For example, the organic light emitting layer is formed by an ink-jet printing method. For example, the main layer 1041 having a hydrophilic property absorbs the ink-jet printing liquid, such as ink, in the pixel region defined by the pixel definition layer pattern 104, and the oxide layer 1042 having a hydrophobic property will exclude the liquid, for example the ink, falling on it to the pixel region defined by the pixel definition layer pattern 104.

For example, the organic light emitting layer 105 is a single layer or a composite structure composed of a plurality of layers. For example, in addition to the organic light emitting layer 105, a hole injecting layer, a hole transport layer, an electroluminescent material layer, an electron transport layer, an electron injection layer and other structure may be further formed in the organic light emitting device according to requirement.

For example, in a case that the first electrode 102 is an anode, the preparation process of forming the organic light emitting layer 105 on the first electrode 102 further comprises: forming a hole injection layer on the first electrode 102, forming a hole transport layer on the hole injection layer, forming an organic light emitting layer on the hole transport layer, forming an electron transport layer on the organic light emitting layer, and forming an electron injecting layer on the electron transport layer.

As illustrated in FIG. 2g, forming a second electrode 106 on the organic light emitting layer 105.

For example, the second electrode 106 is made of metal material, such as Ag, Al, Ca, In, Li or Mg, or their alloys (such as Mg—Ag alloy). For example, the second electrode 106 is made of indium tin oxide (ITO), indium oxide (IZO), indium gallium oxide (IGO), carbon nanotubes, and the like.

The second electrode 106 is not limited to be arranged in the pixel region defined by the pixel definition layer pattern 104. As illustrated in FIG. 2g, the second electrode is disposed on a side of the pixel definition layer pattern 104 distal to the base substrate 101 and serves as a common electrode.

In the preparation process of the display substrate provided by the embodiment of the present disclosure, it is not limited to the case that the first electrode is manufactured after the formation of pixel definition layer pattern. For example, depositing a first electrode film on the base substrate firstly, and patterning the first electrode film to obtain the first electrode; forming a pixel definition layer on the base substrate, then performing an oxidation treatment, a curing and molding process and a patterning process sequentially on the pixel definition layer to obtain the pixel definition layer pattern, and then continuing the subsequent preparation process.

At least one embodiment of the present disclosure relate to a display substrate, a manufacturing method thereof, and a display device, which have at least one beneficial effects described below:

(1) At least one embodiment of the present disclosure provides a display substrate and a manufacturing method thereof, the preparation process of the pixel definition layer pattern included in the display substrate comprises: forming a pixel definition layer made of hydrophobic property material, such as siloxane based organic material, then a surface of the pixel definition layer is oxidized, the oxidized portion of the surface of the pixel definition layer is transformed into an oxide layer having hydrophobic property, the-non oxidized portion proximal to the base substrate is still a main layer having hydrophilic property, after a curing and molding process, the pixel definition layer pattern is a two-layer structure having hydrophilic-hydrophobic property, in this way, the preparation process is simplified and the cost is reduced.

(2) In the display substrate and the manufacturing method thereof provided by at least one embodiment of the present disclosure, there is no interface problem in the obtained pixel definition layer because the pixel definition layer is not easy to stratification, and the stability of the pixel definition layer is increased.

In the present disclosure, the following statements should be noted:

(1) In the drawings of the embodiment of the disclosure, only involves the structure relates to the structure of the embodiment of the disclosure, and other structures can refer to the usually design.

(2) For the sake of clarity, in the drawings of each embodiment of the present disclosure, the thickness of a layer or a region is enlarged or reduced, that is, these drawings are not drawn in an actual proportion.

(3) In the case of non conflict, the embodiment of the present disclosure and the characteristics of the embodiment can be combined with each other to obtain a new embodiment.

What are described above is related to the illustrative embodiments of the disclosure only and not limitative to the scope of the disclosure. Therefore, the scopes of the disclosure are defined by the accompanying claims.

The application claims priority of Chinese Patent Application No. 201611082981.4, filed on Nov. 30, 2016, the disclosure of which is incorporated herein by reference in its entirety as part of the present application.

What is claimed is:

1. A display substrate, comprising:
   a base substrate;
   a pixel definition layer pattern disposed on the base substrate, wherein the pixel definition layer pattern comprises a main layer proximal to the base substrate and an oxide layer distal to the base substrate, a material layer for forming the pixel definition layer pattern is partially oxidized to obtain the main layer and the oxide layer;
   the pixel definition layer pattern is made of siloxane based organic material, and the siloxane based organic material comprises at least one of hydroxylated polydimethylsiloxane or polystyrene block polydimethylsiloxane.

2. The display substrate according to claim 1, wherein the main layer is configured to be a hydrophilic layer, and the oxide layer is configured to be a hydrophobic layer.

3. The display substrate according to claim 1, wherein a thickness of an oxidized portion of the pixel definition layer pattern is 30% to 80% of a total thickness of the pixel definition layer pattern.

4. The display substrate according to claim 1, wherein in a direction perpendicular to a plane of the base substrate, the pixel definition layer has a thickness ranged from 1 μm to 2 μm.

5. The display substrate according to claim 1, further comprising an organic light emitting device arranged in a pixel region defined by the pixel definition layer pattern.

6. The display substrate according to claim 5, wherein the organic light emitting device comprises a first electrode arranged on the base substrate, an organic light emitting layer arranged on the first electrode and a second electrode arranged on the organic light emitting layer.

7. A display device, comprising the display substrate according to claim 1.

8. A method for manufacturing a display substrate, comprising:
   providing a base substrate;
   forming a pixel definition layer on the base substrate;
   oxidizing the pixel definition layer, wherein a surface of the pixel definition layer distal to the base substrate is partially oxidized, such that the pixel definition layer comprises a main layer proximal to the base substrate and an oxide layer distal to the base substrate;

curing and molding the pixel definition layer, and patterning the pixel definition layer to form a pixel definition layer pattern.

9. The method according to claim 8, wherein the main layer is a hydrophilic layer, and the oxide layer is a hydrophobic layer.

10. The method according to claim 8, wherein the pixel definition layer pattern is made of siloxane based organic material, and the siloxane based organic material comprises at least one of hydroxylated polydimethylsiloxane or polystyrene block polydimethylsiloxane.

11. The method according to claim 8, wherein the pixel definition layer is partially oxidized by ultraviolet light or ozone.

12. The method according to claim 8, wherein a thickness of the oxidized portion of the pixel definition layer pattern is 30% to 80% of a total thickness of the pixel definition layer.

13. The method according to claim 8, wherein in a direction perpendicular to a plane of the base substrate, the pixel definition layer has a thickness ranged from 1 μm to 2 μm.

14. The method according to claim 8, wherein a temperature for curing and molding the pixel definition layer is in a range from 25° C. to 100° C.

15. The method according to claim 8, wherein a time for curing and molding the pixel definition layer is in a range from 0.5 hour to 6 hours.

16. The method according to claim 8, further comprising:
forming an organic light emitting device in a pixel region defined by the pixel definition layer pattern.

17. The method according to claim 16, wherein forming the organic light emitting device comprises:
forming a first electrode on the base substrate;
forming an organic light emitting layer on the first electrode; and
forming a second electrode on the organic light emitting layer.

18. The method according to claim 17, wherein the organic light emitting layer is formed by an ink-jet printing method.

* * * * *